(12) United States Patent
Yamagajo et al.

(10) Patent No.: US 7,516,901 B2
(45) Date of Patent: Apr. 14, 2009

(54) RFID TAG

(75) Inventors: Takashi Yamagajo, Yokosuka (JP); Toru Maniwa, Setagaya (JP); Manabu Kai, Yokosuka (JP); Shunji Baba, Kawasaki (JP); Yuichi Nakanishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 251 days.

(21) Appl. No.: 11/256,056

(22) Filed: Oct. 24, 2005

(65) Prior Publication Data

US 2006/0208095 A1 Sep. 21, 2006

(30) Foreign Application Priority Data

Mar. 16, 2005 (JP) ............................. 2005-075379

(51) Int. Cl.
*G06K 19/06* (2006.01)
(52) U.S. Cl. ..................... 235/492; 235/451; 340/572.7
(58) Field of Classification Search ................. 235/492, 235/451, 441, 380, 487; 340/572.7, 572.4; 343/572.4, 700
See application file for complete search history.

(56) References Cited

U.S. PATENT DOCUMENTS

| 6,421,013 | B1 * | 7/2002 | Chung ................. 343/700 MS |
| 7,262,701 | B1 * | 8/2007 | Nguyen ................... 340/572.7 |
| 2003/0075608 | A1 * | 4/2003 | Atherton ..................... 235/492 |
| 2006/0220871 | A1 * | 10/2006 | Baba et al. ............... 340/572.7 |
| 2007/0200711 | A1 * | 8/2007 | Kai et al. ................. 340/572.7 |

* cited by examiner

*Primary Examiner*—Edwyn Labaze
(74) *Attorney, Agent, or Firm*—Hanify & King, P.C.

(57) ABSTRACT

With the RFID comprising a transmitting and receiving antenna, a detecting block formed in the circumference of the antenna, and an electronic component connected to the antenna and detecting block to detect breakdown of the detecting block, illegal use can be prevented, matching between the tag antenna and IC chip can also be attained with inclusion of the detecting means, and higher radiation and receiving characteristics of antenna can also be obtained without deterioration of antenna gain. Moreover, the RFID is very effective for keeping security because illegal use of the RFID tag through re-adhesion thereof to an item can be prevented.

12 Claims, 10 Drawing Sheets

RFID TAG

BACKGROUND OF THE INVENTION

1. Field of the Invention

The present invention relates to an RFID (Radio Frequency Identification) tag. The "RFID tag" used in the present specification is also called an "Inlay for RFID tag" because it is also used as an internal structural member (inlay) for an "RFID tag". Otherwise, the "RFID tag" is also called a "radio IC tag". Moreover, this "RFID tag" includes a non-contact type IC card.

2. Description of the Related Art

In recent years, an external device represented by a reader/writer and various RFID tags for exchanging information using radio waves on a non-contact basis have been proposed. As a kind of such RFID tags, a tag having a structure such that an antenna pattern for radio wave communication and an IC chip are mounted on a base sheet formed of plastic or paper has also been proposed. The RFID tag of the type explained above is considered to be used in such a mode that such a tag is attached to items and these items can be identified through an exchange of information of such items using an external device.

In such an application mode of the RFID tag, illegal use to obtain, for example, an expensive item as a low price item by peeling the RFID tag attached to a certain item, then attaching this RFID to the other item to control the external device to erroneously recognize the relevant item may be assumed. Therefore, a technique to avoid such illegal use has been requested.

Under such a present situation, a technique for disabling communication by generating breakdown of the antenna pattern at the time of peeling the RFID tag has also been proposed (for example, patent documents 1 to 8).

Figure 1:
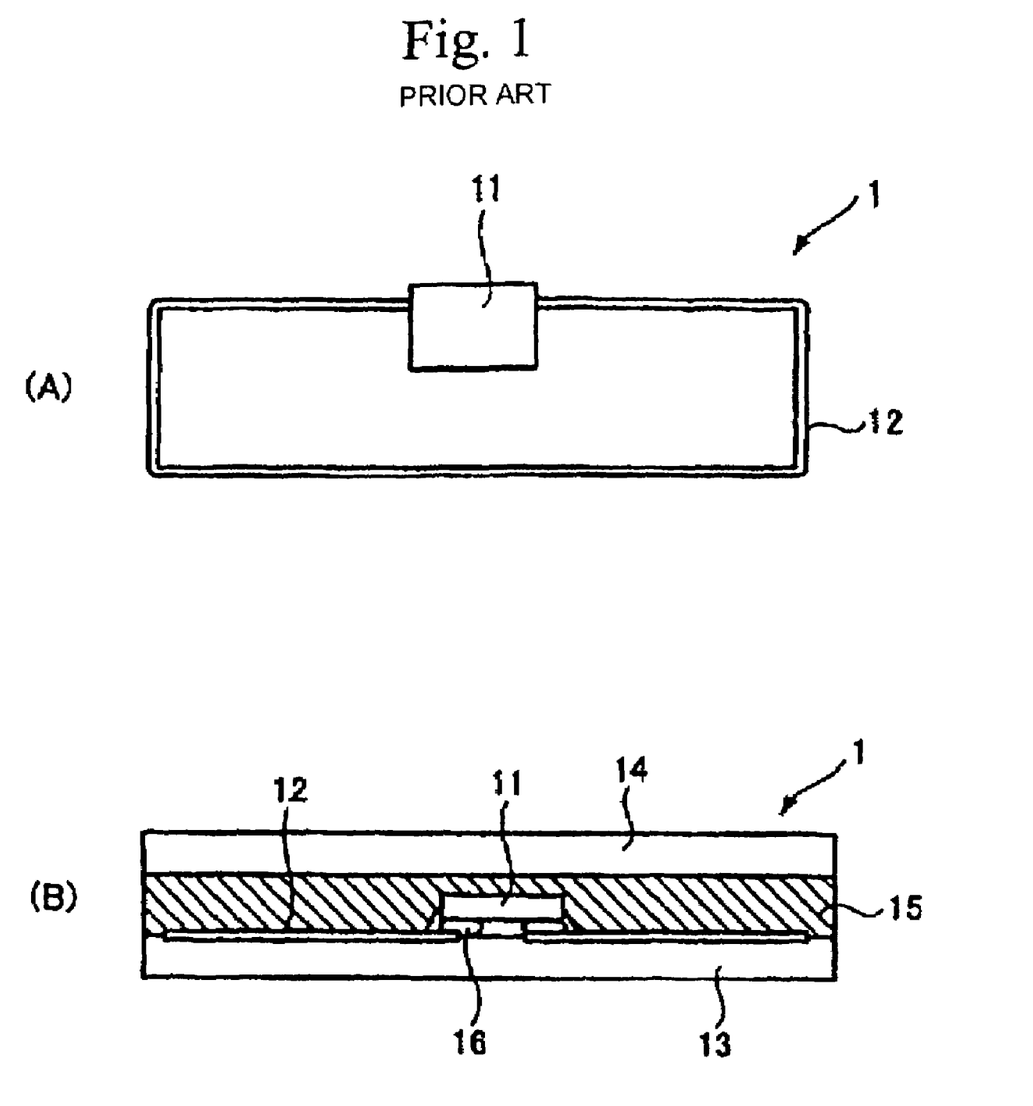
FIG. 1 is a front elevation (A) and a side elevation (B) illustrating the condition before peeling of the RFID in the related art.

FIG. 1 is a front elevation (A) and a side elevation (B) illustrating the condition before peeling of the RFID tag based on the related art.

The RFID tag 1 illustrated in FIG. 1 is formed of an antenna pattern provided on a base sheet 13, an IC chip 11 connected to the antenna pattern 12 with a bump 16, and a cover sheet 14 bonded to the base sheet 13 with a bonding agent 15 covering the antenna pattern 12 and IC chip 11.

This RFID tag 1 is used through bonding to an item in the side of the base sheet 13. A bonding force of the bonding agent 15 is set weaker than that when the side of base sheet 13 is bonded to an item. Therefore, if the RFID tag 1 is peeled by an illegal user who is trying to conduct illegal use, the cover sheet 14 is peeled from the base sheet 13.

Moreover, the antenna pattern 12 is provided to and fro with regions, which are rather weak in bonding with the base sheet 13.

Figure 2:
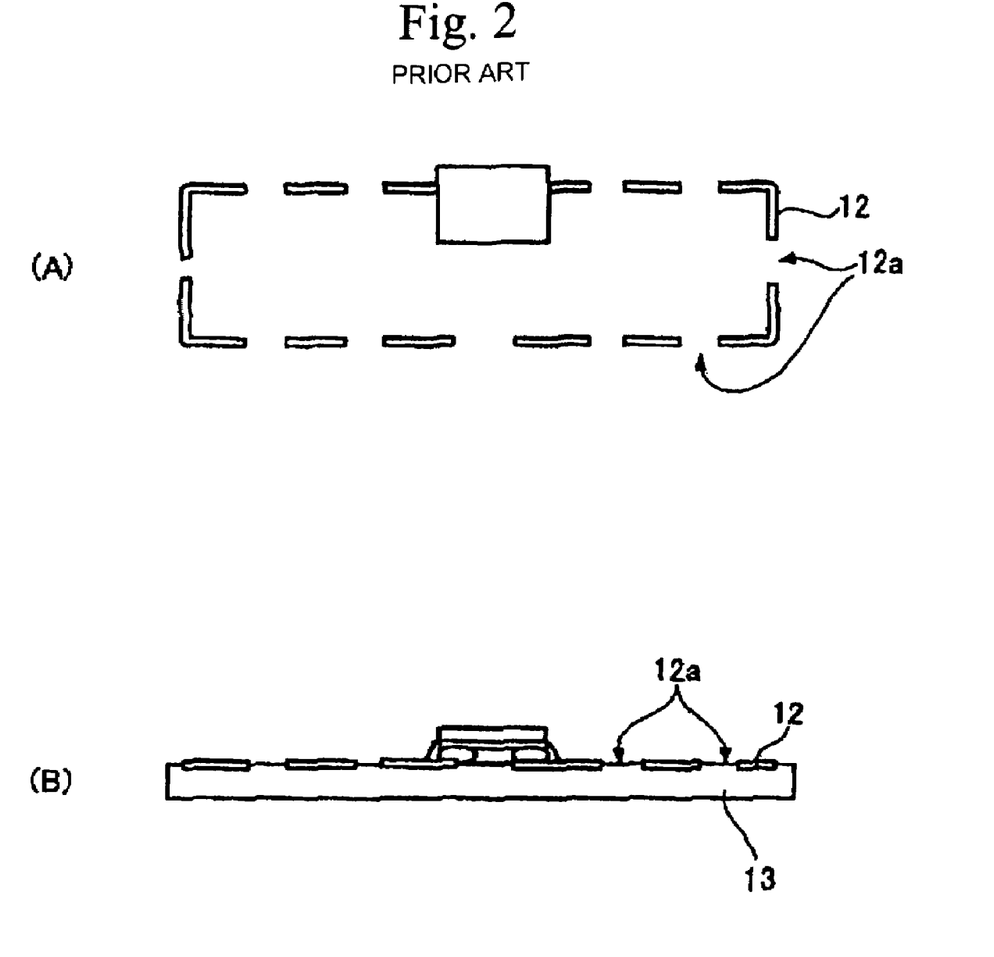
FIG. 2 is a front elevation (A) and a side elevation (B) illustrating the condition after peeling of the RFID in the related art.

FIG. 2 is a front elevation (A) and a side elevation (B) of the condition after peeling of the RFID tag in the related art.

When the cover sheet 14 illustrated in FIG. 1 is peeled from the base sheet 13, the antenna pattern 12 is peeled together with the cover sheet 14 at the areas 12a where the bonding with the base sheet 13 is weak. Accordingly, the antenna pattern 12 loses its function as a communication antenna, disabling communication.

As a technique for avoiding illegal use, a technique has been proposed, in which an exclusive pattern broken at the time of peeling is provided to the RFID tag in addition to the antenna pattern and a breakdown of the exclusive pattern is detected with an IC chip.

Figure 3:
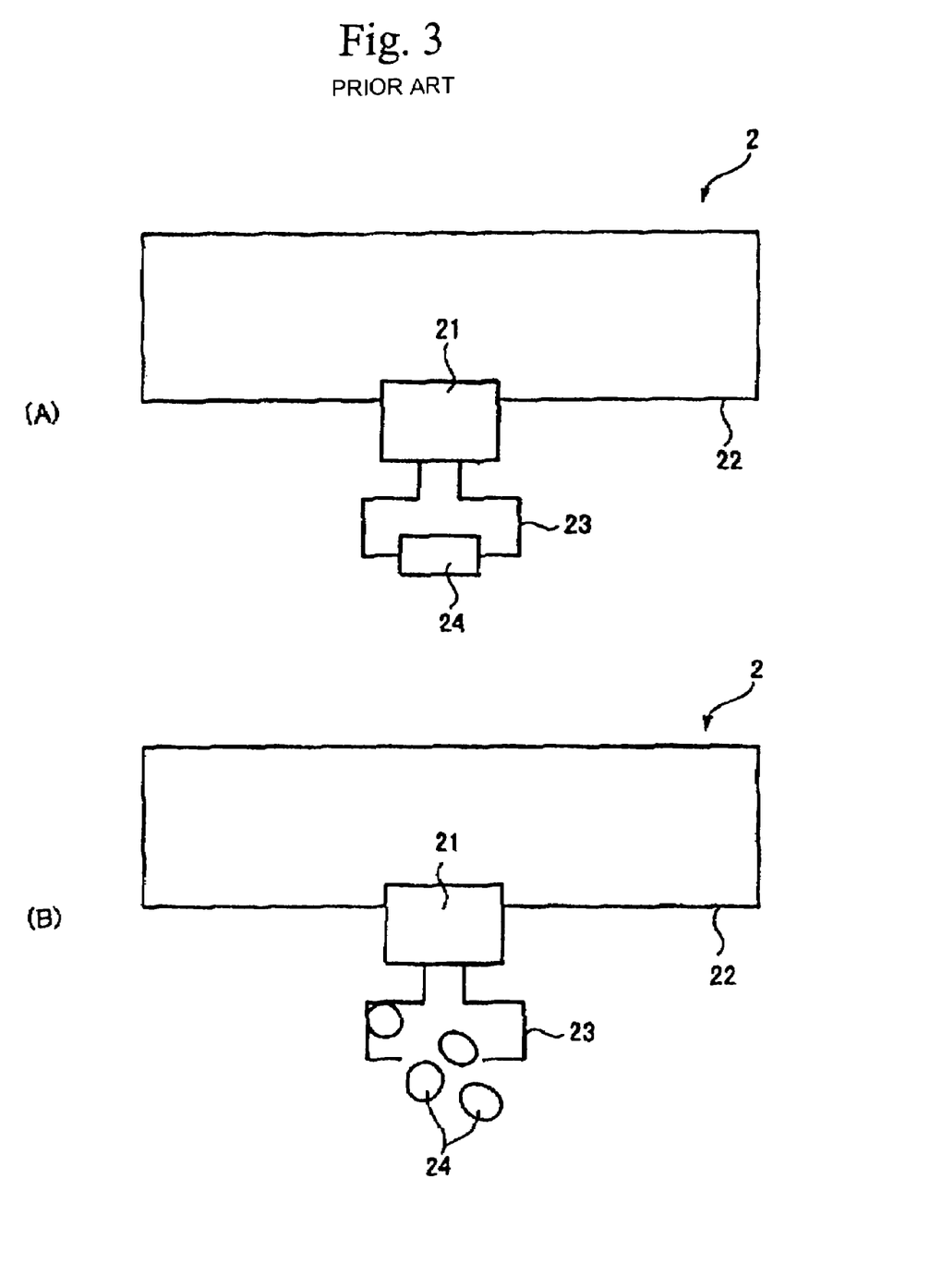
FIG. 3 is illustrates a condition before peeling (A) and a condition after peeling (B) of the other RFID in the related art.

FIG. 3 is a condition (A) before peeling and a condition after peeling of the other RFID tag in the related art.

The RFID tag 2 illustrated in FIG. 3 is provided with an antenna pattern 22, an IC chip 21 connected to the antenna pattern 22, and a pattern 23 for breakdown which is made conductive with a conductive ink 24. Moreover, although not illustrated, a base sheet and a cover sheet are also provided like the RFID tag illustrated in FIG. 1.

In the case of this RFID tag 2, the cover sheet is peeled from the base sheet when an illegal user who is trying to conduct illegal use peels the RFID tag 2. In the case of this RFID tag 2, the conductive ink 24 splashes for setting the pattern 23 for breakdown to the insulating condition when the cover sheet is peeled. Meanwhile, the IC chip 21 detects such insulating condition of the pattern 23 for breakdown. Moreover, breakdown of the pattern can also confirmed visually with the conductive ink 24 splashed.

In the case of the RFID tag 2 illustrated in FIG. 3, the antenna pattern 22 and communication function are maintained even after the cover sheet is peeled and peeling of the RFID tag 2 is notified to an external device at the time of communication with the external device.

Examples of such technology may be found in patent documents such as U.S. Patent Application Publication No. 2003/075608, U.S. Pat. No. 6,421,013, U.S. Patent Application Publication No. 2003-524811, Japanese Patent Document JP-A No. 2003-173477, Japanese Patent Document JP-A No. 2005-31153, U.S. Patent Application Publication No. 2003-517659, Japanese Patent Document JP-A No. 2003-346121, Japanese Patent Document JP-A No. 2002-362613, and Japanese Patent Document JP-A No. 2002-150248.

However, the related art, as explained above has a problem in that since a part of the tag is broken when the RFID is peeled and the broken area is apparent, a motive or a chance to repair the broken area will be given to a person who is trying to illegally use the tag and thereby the effect for eliminating illegal use becomes insufficient. Moreover, in the related art, a reader such as the reader/writer is controlled to erroneously recognize the item information when the RFID tag attached to a certain item is peeled and then attached again to the other item.

For example, an illegal use may be assumed here. Namely, the RFID tag to which low price item information is written is once peeled from the item and is then attached again to an expensive item for giving a false price. Therefore, the technique for avoiding such illegal use has been expected.

SUMMARY OF THE INVENTION

Considering the background explained above, an object of the present invention is to provide an RFID tag which ensures a higher effect for avoiding illegal use and can obtain higher radiation and receiving characteristics of antenna.

According to one aspect of the present invention, the RFID tag having an antenna and an electronic component comprises, in order to attain the object explained above, in that a transmitting and receiving antenna, a detecting block formed in the circumference of the antenna, and an electronic component connected to the antenna and a detecting block to detect breakdown of the detecting block.

According to the second concept of the present invention, the RFID tag having an antenna and an electronic component comprises a transmitting and receiving antenna, a detecting block formed in the circumference of the antenna, and an electronic component connected to the antenna and detecting block to detect breakdown of the detecting block, and moreover the detecting block has the length of a non-integer times of a half-wave length.

According to the third concept of the present invention, the RFID tag having an antenna and an electronic component comprises a transmitting and receiving antenna, a detecting block formed in the circumference of the antenna, and an electronic component connected to the antenna and detecting block to detect breakdown of the detecting block, and moreover the detecting block is formed of a conductive material and a loop of two lines.

According to the fourth concept of the present invention, the RFID tag having an antenna and an electronic component comprises a transmitting and receiving antenna, a detecting block formed in the circumference of the antenna, and an electronic component connected to the antenna and detecting block to detect breakdown of the detecting block, and moreover the detecting block is formed of a loop in which an interval of two lines is narrow.

According to the fifth concept of the present invention, the RFID tag having an antenna and an electronic component comprises a transmitting and receiving antenna, a detecting block formed in the circumference of the antenna, and an electronic component connected to the antenna and detecting block to detect breakdown of the detecting block, and moreover the detecting block is formed in the shape attained by folding back a single loop.

According to the sixth concept of the present invention, the RFID tag having an antenna and an electronic component comprises a transmitting and receiving antenna, a detecting block formed in the circumference of the antenna, and an electronic component connected to the antenna and detecting block to detect breakdown of the detecting block, and moreover the detecting block is formed in the U-shape attained by folding back the single loop.

According to the seventh concept of the present invention, the RFID tag having an antenna and an electronic component comprises a transmitting and receiving antenna, a detecting block formed in the circumference of the antenna, and an electronic component connected to the antenna and detecting block to detect breakdown of the detecting block, and moreover the detecting block is formed of silver paste and the antenna is formed of copper.

According to the eighth concept of the present invention, the RFID tag having an antenna and an electronic component comprises a transmitting and receiving antenna, a detecting block formed in the circumference of the antenna, and an electronic component connected to the antenna and detecting block to detect breakdown of the detecting block, and moreover the antenna has a folded dipole antenna, dipole antenna, fine dipole antenna, loop antenna, fine loop antenna, and meander structure.

According to the ninth concept of the present invention, the RFID tag having an antenna and an electronic component comprises a transmitting and receiving antenna, a detecting block formed in the circumference of the antenna, and an electronic component connected to the antenna and detecting block to detect breakdown of the detecting block, a first film mounting the antenna, detecting block, and electronic component, a second film covering the antenna, detecting block, and electronic component, and a wall block provided at the external side to surround a part of the detecting block between the first film and the second film and is strictly bonded to the second film.

According to the tenth concept of the present invention, the RFID tag having an antenna and an electronic component comprises a transmitting and receiving antenna, an electronic component connected to the antenna and detecting block to detect breakdown of the detecting block, a first film mounting the antenna, detecting block and electronic component, a second film covering the antenna, detecting block, and electronic component, and a wall block provided at the external location to surround a part of the detecting block between the first film and the second film to strictly bond the second film, and that the wall block is formed of a thermosetting resin and is coated with a material which may be peeled at the surface in contact with the first film.

DETAILED DESCRIPTION OF THE PREFERRED EMBODIMENTS

The preferred embodiments of the present invention will be explained with reference to the accompanying drawings. However, these embodiments do not restrict the technical scope of the present invention.

In the preferred embodiments of the present invention, the structure and operation of the RFID tag used to prevent illegal use will be explained below.

Figure 4:
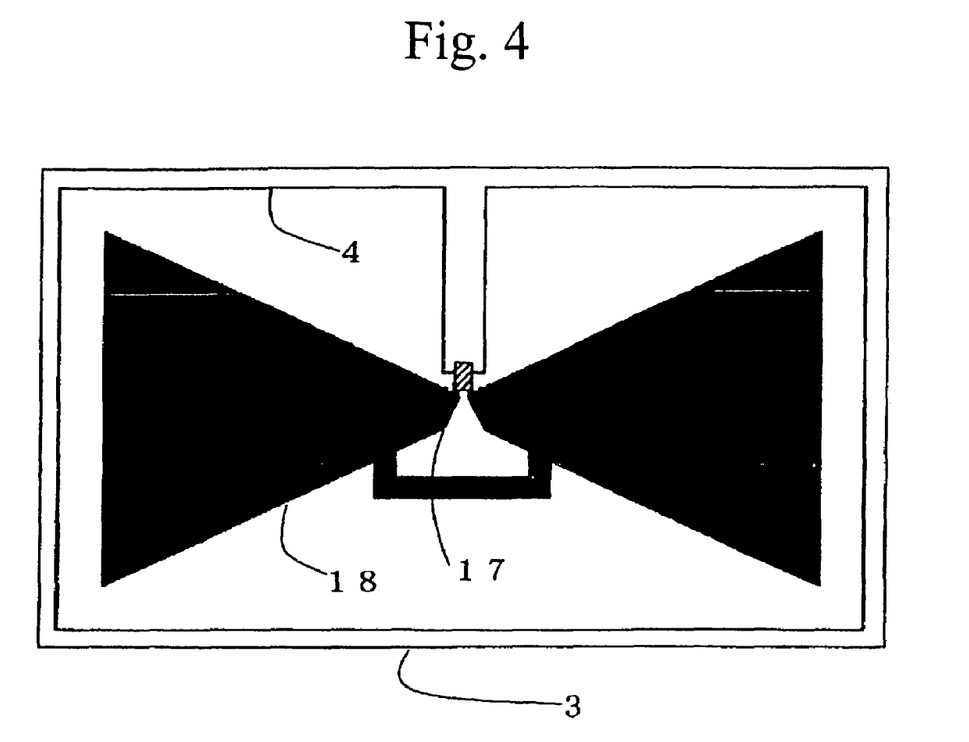
FIG. 4 is a diagram illustrating a first embodiment of the RF tag in the present invention.

FIG. 4 illustrates a structure of a first embodiment of the RFID tag of the present invention. In this RFID tag, the operating frequency is assumed as about 950 MHz but another frequency may also be selected. The size of this RFID tag is set to 120 mm×60 mm.

In the RFID tag, an antenna 18 is formed on a film sheet 3 and a detecting block 4 is formed in the circumference of the antenna 18.

Moreover, an IC chip 17 is arranged in the manner as bridging over the antenna 18 and a detecting block 4. The film sheet is formed of a dielectric material substrate such as FR-4 and so or PET (abbreviation of Polyethylene Telephthalate). The detecting block 4 is formed of a single loop in a length of about 29 cm. The RF tag forms a loop as the detecting block 4 in the circumference of the antenna 18 on the film sheet 3 as illustrated in FIG. 4. Moreover, the antenna 18 and IC chip 17 and so on are covered with a cover sheet (not illustrated). Actually, the RF tag is bonded to an item at the film sheet 3 as the bonding surface using a bonding agent or a double-sided adhesive tape and so. A person who is trying illegal use successfully peels the RF tag bonded to a low price item from the cover sheet and bonds the tag again to an expensive item for illegal use. However, the RF tag of the present invention is not only provided with a detection pattern, in order to prevent illegal use, but also forms a single loop in the circumference of the antenna 18 to detect illegal use even when the sheet is peeled from any direction.

Moreover, an IC chip 17 of the RF tag detects, if a part of the loop of detecting block 4 opens due to breakdown by peeling of the sheet, opening of this loop and transmits the item information to be transmitted with the addition of the information indicating occurrence of breakdown (illegal use recognizing information)(not illustrated), upon judgment that illegal use has been conducted to a reader or management apparatus and so (not illustrated) via the antenna 18. Thereby, an administrator can recognize that the RF tag under the illegal use exists. Moreover, when the IC chip 17 detects illegal use, the RF tag is also capable of setting the function to prevent illegal use such as locking to disable write of information from the external side, erasing of the write information, and disable of all operations of the IC chip 17 after transmission of the information indicating occurrence of breakdown.

Figure 5:
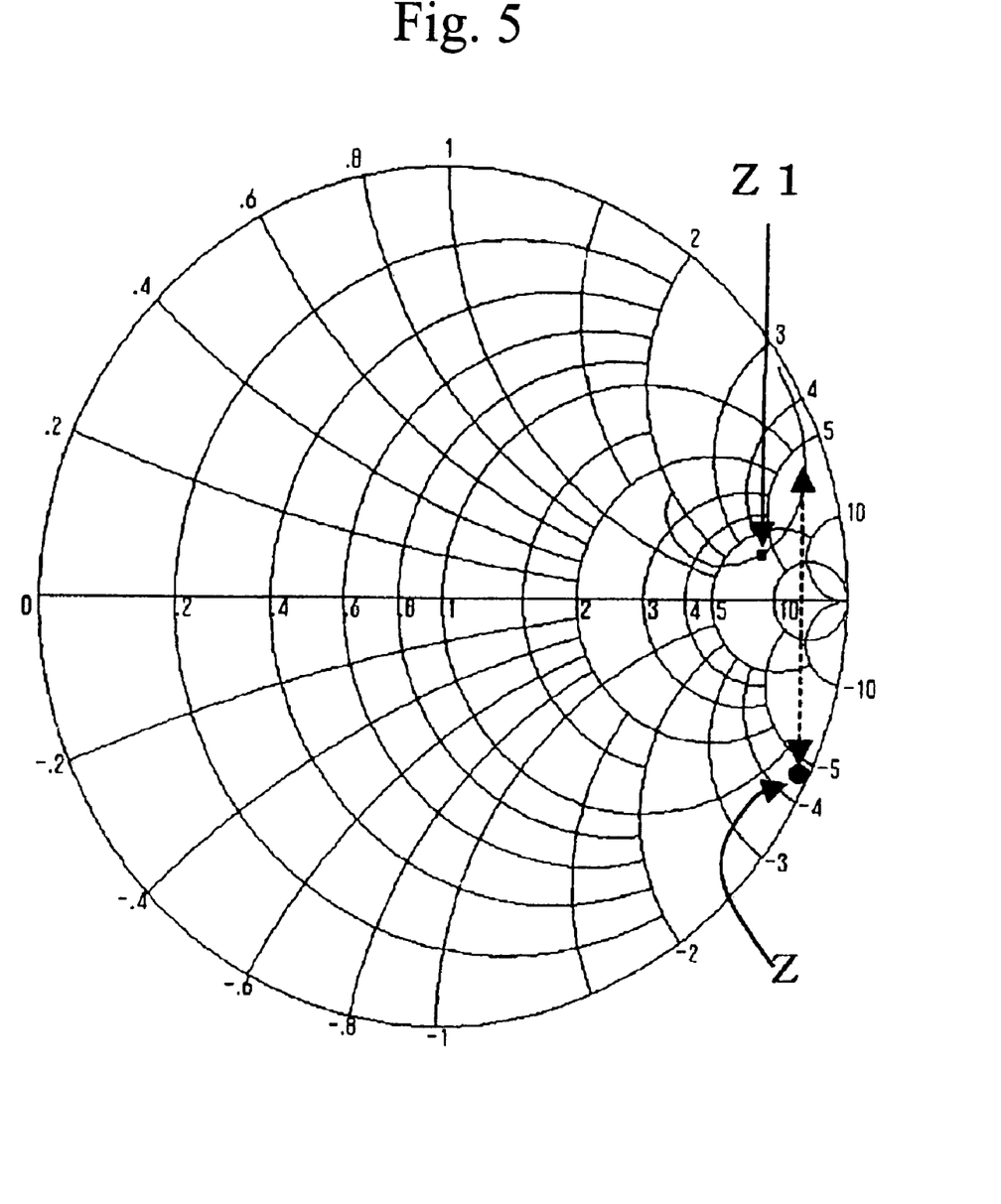
FIG. 5 is a diagram illustrating antenna impedance of a first embodiment of the RF tag in the present invention.

FIG. 5 illustrates antenna impedance in the first embodiment of the RF tag in the present invention. This RF tag sets the impedance of the IC chip 17 observed from the pattern of the detecting block 4 in FIG. 4 as 50 Ω. Moreover, the impedance of the IC chip 17 observed from the antenna is set to $Z=36-j245[\Omega]$.

Accordingly, the antenna impedance Z1 becomes equal to $323+j192[\Omega]$. When Z1 is normalized to 50 Ω, $Z1=323/50+j192/50=6.46+j3.84[\Omega]$ is obtained. When Z is normalized to 50 Ω, $Z=36-j245=0.72+j4.9[\Omega]$ is obtained. FIG. 5 illustrates the normalized impedances plotted on the Smith chart. The operation frequency is set to 950 MHz.

As will be understood from above explanation, the antenna impedance Z1 and impedance of IC chip 17 $Z=36-j245[\Omega]$ are not in the conjugate relation and matching is not yet attained. The antenna gain of FIG. 5 becomes equal to −5.4 dBi. From this fact, it can be said that both antenna gain and impedance matching between the antenna and IC chip are deteriorated.

dBi used here is called the absolute gain. The absolute gain can be obtained as a ratio of the intensity of radio waves at an area far away from a non-directional antenna when the radio wave is radiated at a reference power to space from such a non-directional antenna to the intensity of radio waves of the antenna used measured in an equal condition as that for measurement with the non-directional antenna. Namely, the absolute gain means the gain of the antenna with reference to a non-directional antenna (isotropic antenna).

In the first embodiment of the RF tag in the present invention, the radiation-receiving characteristic of antenna is not so good due to mismatching of the impedance with IC chip 17. Moreover, in the first embodiment of the present invention, it has been shown that transmission and reception of radio waves to result in the sufficient characteristic are impossible because a single loop is additionally formed in the circumference of the antenna.

Accordingly, the following RF tag can be achieved by forming the structure as an RF tag so that impedance matching can be attained between the antenna and IC chip in order to obtain sufficient characteristics for notifying occurrence of illegal use to an administrator or a reader/writer.

Figure 6:
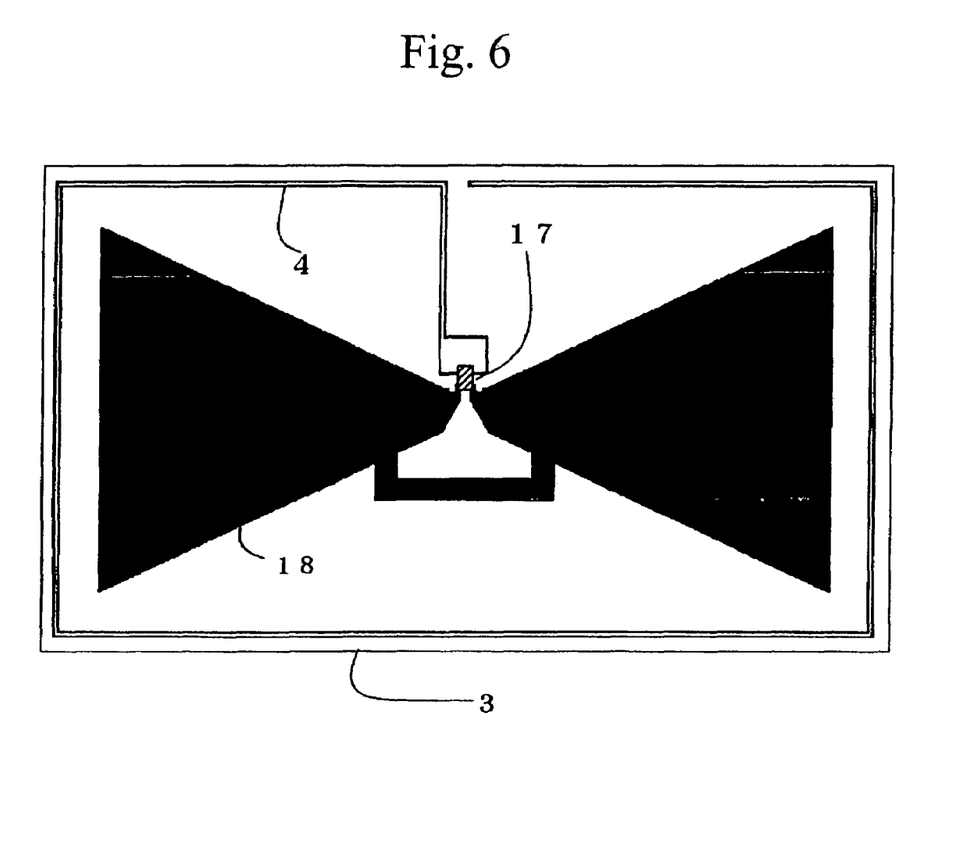
FIG. 6 is a diagram illustrating a second embodiment of the RF tag in the present invention.

FIG. 6 is a diagram illustrating a second embodiment of the RF tag of the present invention. This RFID tag is formed in the size of 120 mm×60 mm, which is similar to that of the first embodiment. This RF tag is different in structure from the detecting block 4 of the RF tag of the first embodiment. The detecting block 41 is formed of a loop consisting of two lines, the internal line and the external line. Moreover, this detecting block 41 forms loops of two lines having a narrow interval. In addition, this detecting block 41 is formed in a shape attained by folding back a single loop. In the RF tag of the second embodiment, antenna 18 is formed on film sheet 3 and detecting block 41 is formed in the circumference of antenna 18.

Moreover, IC chip 17 is arranged bridging over antenna 18 and detecting block 41. The film sheet is constituted, as in the case of the first embodiment, of a dielectric material substrate such as FR-4 and so or PET (abbreviation of Polyethylene Terephthalate). This detecting block 41 has a loop length of about 58 cm. One wavelength of the operating frequency of about 950 MHz is about 31.5 cm and the half-wavelength becomes about 15.7 cm. The loop length of this detecting block 41 deviates from an integer multiple of the half-wavelength as explained in the description of the third embodiment. The RF tag forms a loop as detecting block 41 in the circumference of antenna 18 as illustrated in FIG. 6 and antenna 18 and IC chip 17 and so on the RF tag thereof are covered with the cover sheet (not illustrated).

Figure 7:
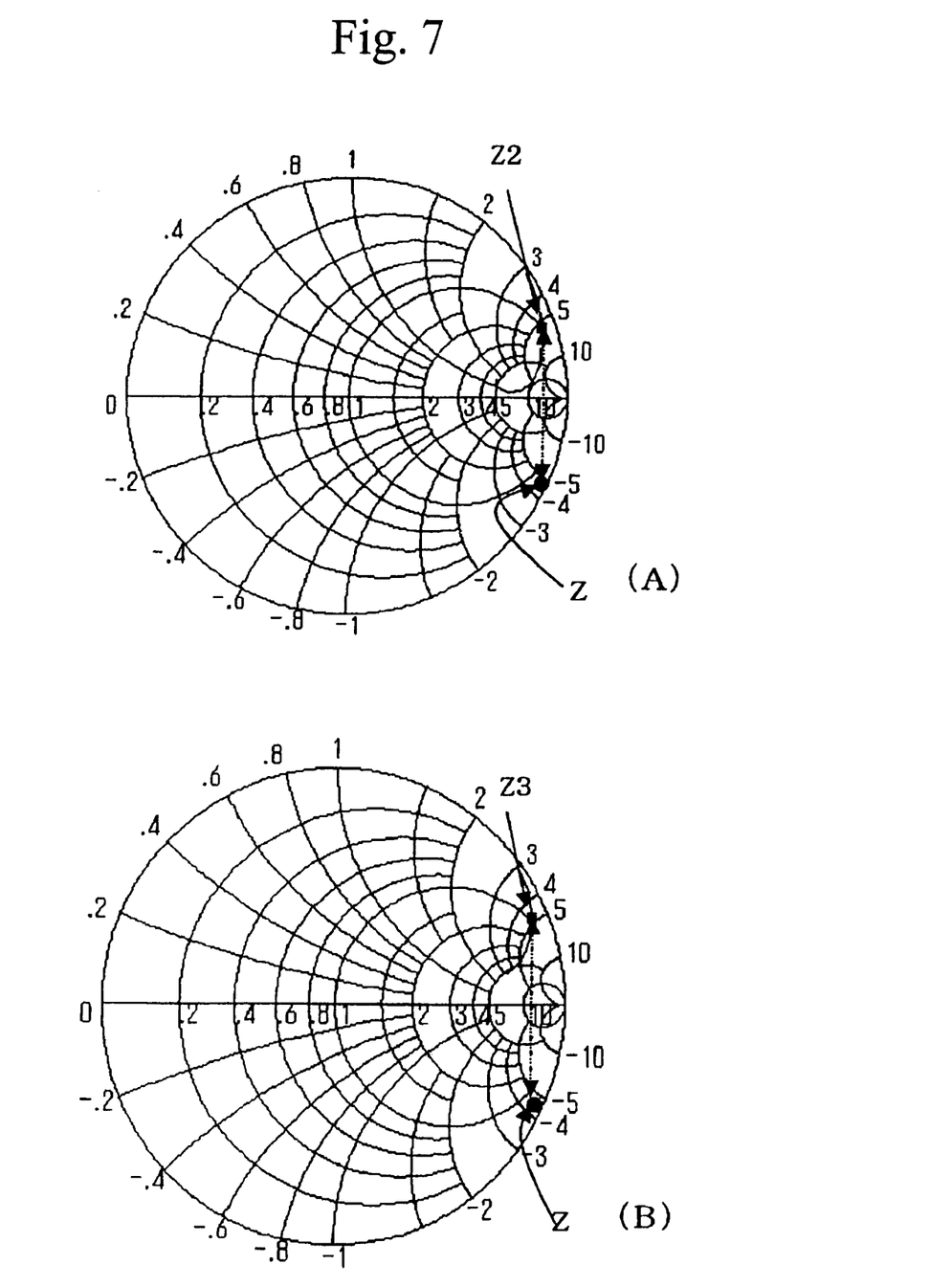
FIG. 7 is a diagram (A) illustrating the antenna impedance when the detecting block is provided and a diagram (B) illustrating the antenna impedance when the detecting block is not provided in a second embodiment of the RF tag in the present invention.

Next, FIG. 7 illustrates the antenna impedance (A) when the detecting block of the second embodiment of the RF tag in the present invention exists and the antenna impedance (B) when the detecting block does not exist. FIG. 7 illustrates the antenna impedances plotted on a Smith chart.

FIG. 7(A) illustrates the impedance when the detecting block 41 of FIG. 6 exists. In this case, the antenna impedance is assumed as Z2. In this RF tag, the impedance Z of IC chip 17 in FIG. 6 becomes equal to $36-j245[\Omega]$. The antenna impedance Z2 becomes equal to $47+j269$ Ω. When Z2 is normalized to 50 Ω, $Z2=47/50+j269/50=0.94+j5.38$ Ω is obtained. When Z is normalized to 50 Ω, $Z=36-j245=0.72-j4.9$ Ω is obtained. The normalized impedances Z, Z2 are plotted on the Smith chart as illustrated in FIG. 7(A). The operating frequency is set to about 950 MHz. The Smith chart FIG. 7(A) shows that Z and Z2 are almost in a conjugate relationship and these are almost matched.

FIG. 7(B) can be obtained by plotting the antenna impedances on the Smith chart when the detecting block 41 is not provided. In this case, the antenna impedance Z3 becomes equal to $44+j236$ Ω. When Z3 is normalized to 50 Ω, $Z3=44/50+j236/50=0.88+j4.72$ is obtained and the normalized Z3 is plotted on the Smith chart. The impedance $Z=36-j245[\Omega]$ of IC chip 17 in FIG. 6 is also plotted on the Smith chart.

As a result, it can be understood that Z and Z3 in FIG. 7(B) are in a more conjugate relationship than that of FIG. 7(A) and sufficient matching is attained. Moreover, when FIG. 7(A) is compared to FIG. 7(B), the antenna impedance does not change to a large extent (matching with IC chip 17 does not deviate a large amount) even when detecting block 41 is provided or not provided. When detecting block 41 is provided as in the case of FIG. 7(A), the antenna gain becomes 1.2 dBi, while if the detecting block 41 is not provided as in the case of FIG. 7(B), the antenna gain becomes 1.6 dBi and it indicates that the antenna gain does not also change a large amount.

Figure 8:
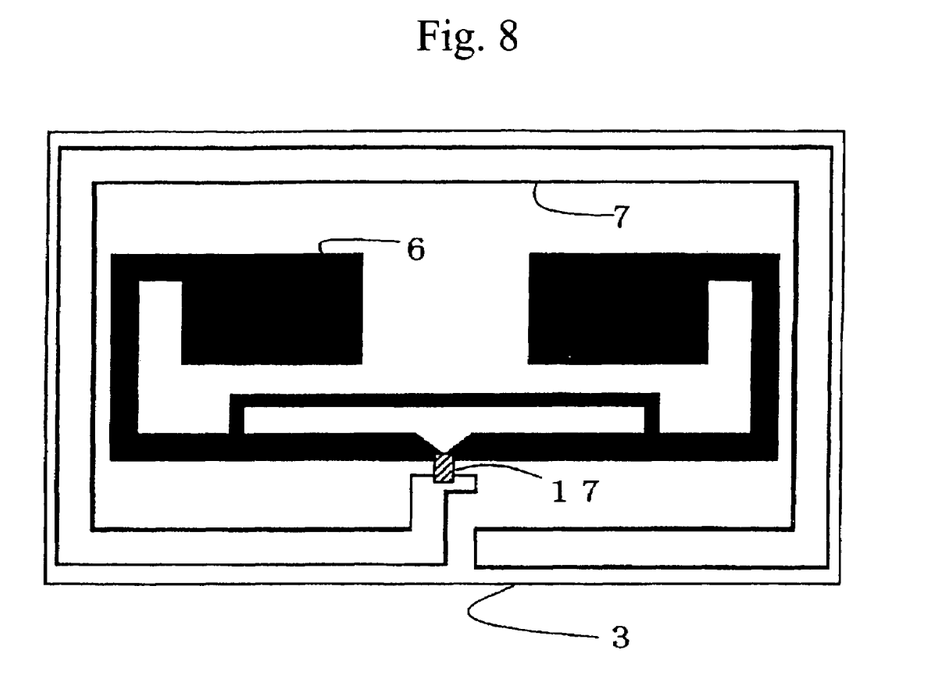
FIG. 8 is a diagram illustrating a third embodiment of the RF tag in the present invention.

FIG. 8 illustrates the third embodiment of the RF tag in the present invention. This RF tag has a structure, which is almost identical to that of the second embodiment, although the shapes of detecting block 41 and the antenna of the RF tag are different. The detecting block 7 is formed as loops of internal line and external line in the circumference of the antenna 6. The difference is that the size of the film sheet in the RF tag is as small as 60 mm×30 mm, which is only a half of that in the first and second embodiments. In the RF tag of the third embodiment, the antenna 6 is formed on film sheet 3 and detecting block 7 is formed in the circumference of antenna 6.

Moreover, IC chip 17 is arranged bridged over antenna 6 and detecting block 7. The film sheet 3 is formed, as in the case of the second embodiment, of a dielectric material substrate, such as FR-4 and so on, or PET (abbreviation of Polyethylene Terephthalate) and so on. This detecting block 7 has a loop length of about 34 cm. One wavelength of the operating frequency of about 950 MHz is about 31.5 cm and a half wavelength is about 15.7 cm. The loop length of detecting block 7 is deviates from an integer multiple of a half-wavelength as explained with reference to FIG. 9.

Figure 9:
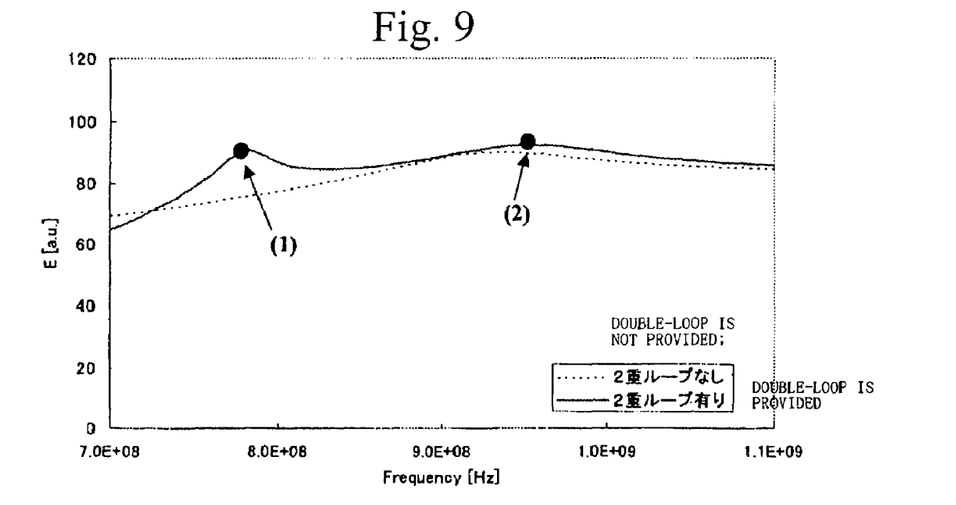
FIG. 9 is a diagram illustrating a radiation spectrum by the antenna of a third embodiment of the RF tag in the present invention.

FIG. 9 illustrates a radiation spectrum of the antenna showing the third embodiment of the RF tag in the present invention. [a.u.] used here is used as a relative unit and is an abbreviation of arbitrary unit. In FIG. 9, field intensity E [a.u.] is plotted on the vertical axis, while frequency is plotted on the horizontal axis. FIG. 9 shows the curve when the detecting block is not provided, namely the double-loop is not provided and the curve when the detecting block 7 is provided, namely the double-loop is provided. In the case where the double-loop is provided (the loops where single-line loop is respectively provided in the internal side and external side), a resonance point (1) of the loop can be found. Moreover, the maximum radiation of the antenna in the RF tag can be found as (2). If the loop length of the detecting block 7 is set to an integer multiple of the half wavelength, the resonance point (1) of the loop will happen to be matched with the maximum radiation (2).

However, such an event is not desirable because the transmission distance may change depending on the occurrence and non-occurrence of disconnection of the loop.

Therefore, in the RFID tag in the present invention, the loop length of detecting block 7 is not set to an integer multiple of a half-wavelength. When the loop length is set to an integer multiple of a half-wavelength, a demerit is generated, in which transmission distance becomes short if the loop is disconnected, even when the RF tag is set at the maximum distance for communication from the reader/writer under the condition that the loop is not disconnected.

Figure 10:
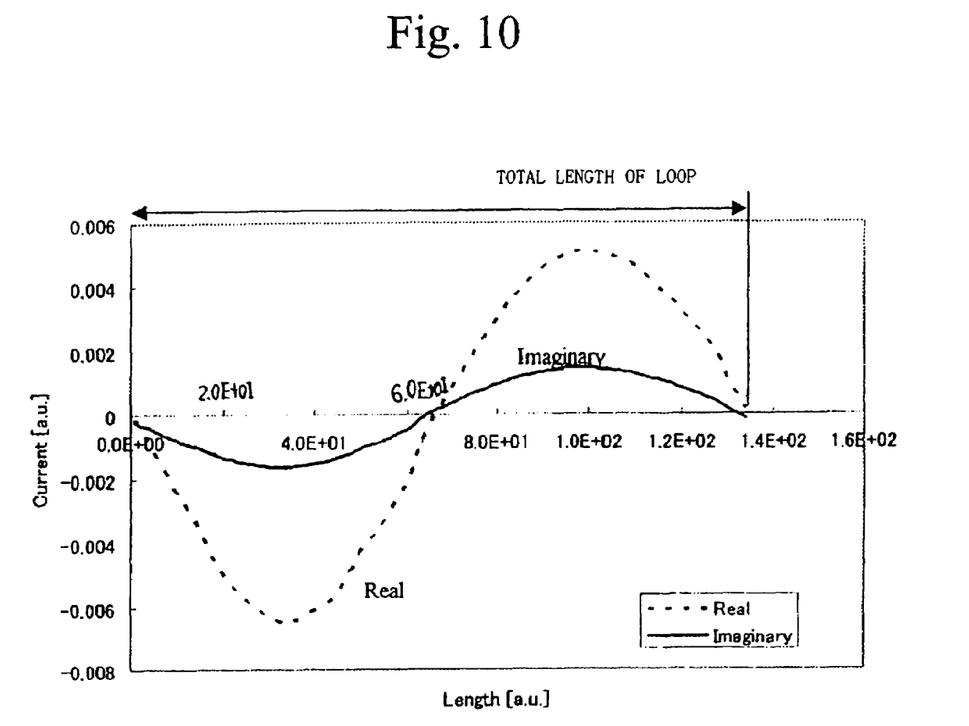
FIG. 10 is a diagram illustrating current distribution in the loop resonance (1) of the radiation spectrum of FIG. 9.

FIG. 10 illustrates the distribution of current under the condition that loop resonance (1) occurs in the radiation spectrum of FIG. 9. Distribution is indicated as the real part being the current distribution in a resistor and as the imaginary part being the current distribution in a reactance. In FIG. 10, the current values are plotted on the vertical axis and loop length on the horizontal axis.

Figure 11:
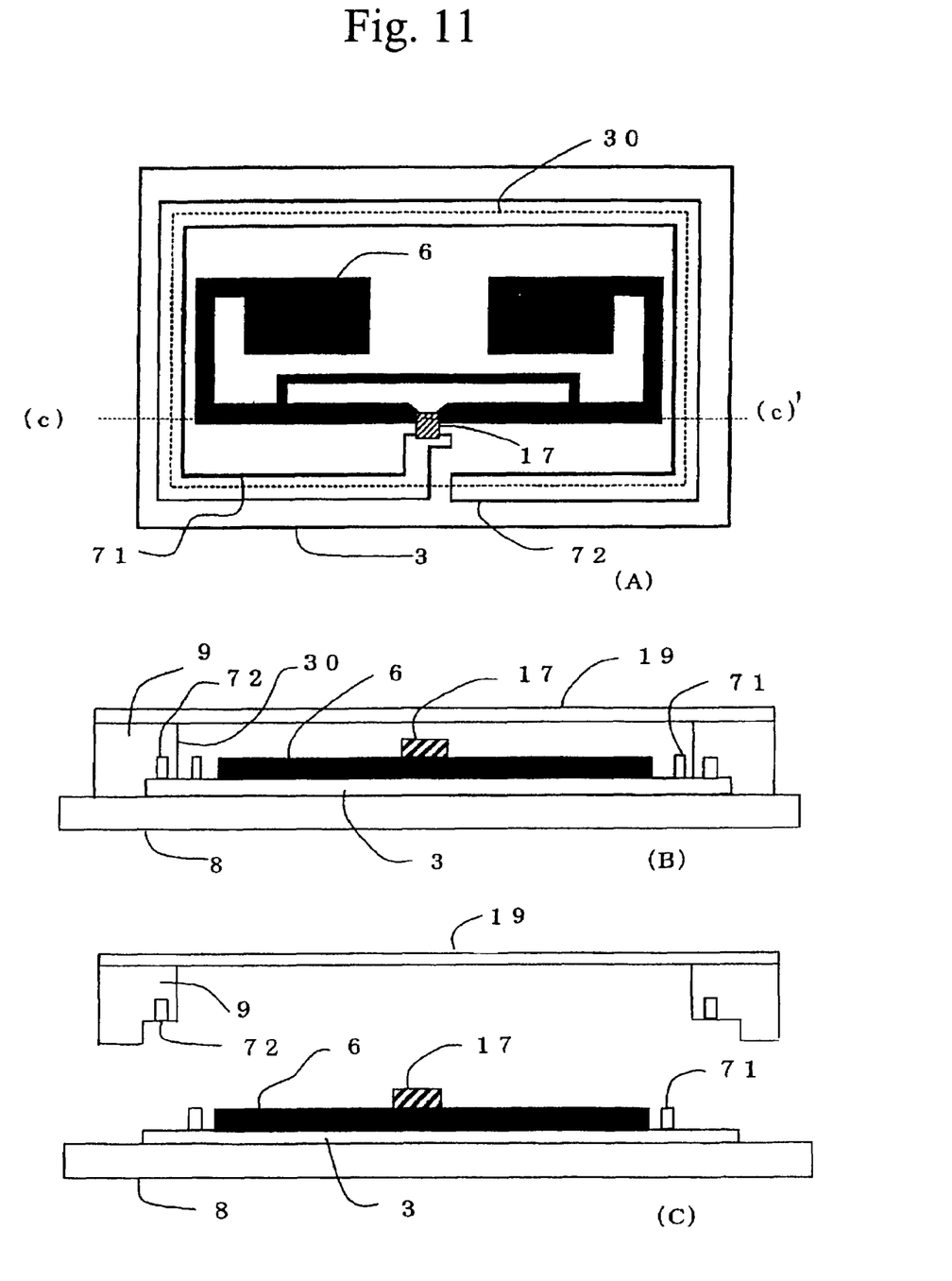
FIG. 11 is a diagram illustrating a fourth embodiment of the RF tag in the present invention.

FIG. 11 illustrates the third embodiment of the RF tag in the present invention. In FIG. 11(A), the antenna 6 is formed on a film sheet 3 and external line 72 and internal line 71 of the detecting block are formed in the circumference of antenna 6 on the film sheet. Moreover, IC chip 17 is arranged bridging over antenna 18 and detecting block 71. The film sheet is formed of a dielectric material substrate such as FR-4 and so on or PET(abbreviation of Polyethylene Terephthalate) and so on. This detecting block (71, 72) is formed of two loops (double-loop) with a loop length of about 29 cm. The RF tag is constituted by coating the detecting block 7 and antenna 6 with a resin or a bonding agent and by covering these elements with the cover film formed thereon (not illustrated). A partitioning block 30 indicates the partitioning location between external line 72 and internal line 71 of the detecting block. For example, only external line 72 of the detecting block can be peeled when the cover film is formed in the structure that a cutting portion is set to the area matched with the partitioning block 30.

FIG. 11(B) is a cross-sectional view of the RF tag when FIG. 11(A) is cut along the line (C)-(C)'.

In the RF tag of FIG. 11(B), film sheet 3 is adhered on a base sheet 8, antenna 6, IC chip 17, external line 72 of the detecting block, and internal line 71 of the detecting block are formed on the film sheet 3, wall block 9 and partitioning block 30 are further formed, and cover film 19 is also formed thereon. The wall block 9 may be formed with a resin like silicone or a bonding agent or may be formed with a material such as that of the cover film. The RF tag may be adhered to the item using the base sheet 8 as the bonding surface. Alternatively, the cover film may be adhered to the item.

FIG. 11(C) is a cross-sectional view where the cover film in cross-sectional view (B) is peeled.

In FIG. 11(C), wall block 9 and external line 72 are also peeled together when cover film 19 of the RF tag is peeled.

Accordingly, only internal line 10 is left as the line of the detecting block in the RF tag adhered to the item, the detecting block is left as single line which is identical to the structure in the first embodiment of the present invention. Thereby, transmission and reception using the antenna is no longer possible and illegal use can be prevented. This RF tag can detect peeling with the detecting block even when the cover film 19 is peeled in any direction. Moreover, the antenna can no longer be used, disabling illegal use. Moreover, in any embodiment of the RF tag explained above, since the detecting block is formed using a transparent and conductive silver paste and so on, and the antenna is formed of copper, it becomes difficult to visually discover the detecting block and the detecting block can easily be peeled from the point of view of preventing illegal use and in addition a higher gain antenna can also be attained from the viewpoint of the transmitting and receiving characteristics.

In addition, any type of structure may be employed for the antenna, selected from folded dipole antenna, dipole antenna, fine dipole antenna, loop antenna, fine loop antenna and meander structure.

The RFID of the present invention can avoid illegal use by introducing the structure explained above and is also capable of achieving higher radiation and receiving characteristics of the antenna without deterioration of antenna gain through matching between the tag antenna and chip with inclusion of a peeling detection means.

Moreover, since the peeling detecting means is provided along the circumference of antenna, peeling of the tag can be detected because the peeling detecting means is also peeled even when the tag is peeled from any direction.

The RFID tag of the present invention is capable of enhancing security in the field of radio tag because illegal use such as re-adhesion thereof to item can be prevented.

What is claimed is:

1. An RFID tag comprising:
   a transmitting and receiving antenna formed on a substrate;
   a detecting block having a pattern formed on the substrate in a circumference of the antenna and operable to detect breakdown of the pattern of the detecting block on the substrate; and
   an electronic component connected to the antenna and the detecting block;
   wherein the detecting block is formed of a conductive material and loops of two lines, and has a length of a non-integer multiple of a half-wavelength of an operating frequency of the RFID tag, in order to not change a transmitting distance regardless of discommunication of the loops.

2. The RFID tag according to claim 1, wherein the detecting block is formed in a shape obtained by folding back a single loop.

3. The RFID tag according to claim 1, wherein the detecting block is formed in a U-shape attained by folding back the single loop.

4. The RFID tag according to claim 1, wherein the detecting block is formed of silver paste and the antenna is formed of copper.

5. The RFID tag according to claim 1, wherein the antenna is a folded dipole antenna, dipole antenna, fine dipole antenna, loop antenna, fine loop antenna, or meander structure.

6. The RFID tag according to claim 1, wherein the detecting block is formed of a conductive and transparent material.

7. An RFID tag comprising:
a transmitting and receiving antenna;
a detecting block having a pattern formed around the antenna;
an electronic component connected to the antenna and detecting block operable to detect breakdown of the pattern of the detecting block;
a first film mounting the antenna, detecting block, and electronic component;
a second film covering the antenna, detecting block, and electronic component; and
a wall block provided at an external side to surround a part of the detecting block between the first film and the second film and is bonded only to the second film;
wherein the detecting block is formed of a conductive material and loops of two lines, and has a length of a non-integer multiple of a half-wavelength of an operating frequency of the RFID tag, in order to not change a transmitting distance regardless of discommunication of the loops.

8. The RFID tag according to claim 7, wherein the wall block is formed of a thermosetting resin and is coated with a material, which may be peeled at a surface in contact with the first film.

9. The RFID tag according to claim 7, wherein the detecting block is formed of a conductive and transparent material.

10. The RFID tag according to claim 7, wherein the wall block and the second film are formed of an identical material.

11. The RFID tag according to claim 7, wherein the second film is provided with a cutting portion at the external circumference to include a part of the detecting block.

12. An RFID tag comprising:
a transmitting and receiving antenna;
a detecting block having a pattern formed around the antenna;
an electronic component connected to the antenna and the detecting block operable to detect breakdown of the pattern of the detecting block; and
a substrate for mounting the antenna, detecting block, and electronic component;
wherein the detecting block is formed of a conductive material and loops of two lines, and has a length of a non-integer multiple of a half-wavelength of an operating frequency of the RFID tag, in order to not change a transmitting distance regardless of discommunication of the loops.

* * * * *